United States Patent [19]

Sugimoto

[11] Patent Number: 5,958,074
[45] Date of Patent: *Sep. 28, 1999

[54] DATA PROCESSOR HAVING DATA BUS AND INSTRUCTION FETCH BUS PROVIDED SEPARATELY FROM EACH OTHER

[75] Inventor: Hideki Sugimoto, Tokyo, Japan

[73] Assignee: NEC Corporation, Tokyo, Japan

[ * ] Notice: This patent is subject to a terminal disclaimer.

[21] Appl. No.: 09/002,785

[22] Filed: Jan. 5, 1998

Related U.S. Application Data

[63] Continuation of application No. 08/523,252, Sep. 5, 1995, Pat. No. 5,706,423.

[30] Foreign Application Priority Data

Sep. 12, 1994 [JP] Japan .................................... 6-243295

[51] Int. Cl.$^6$ .................................................. G06F 11/00
[52] U.S. Cl. .............................. 714/49; 714/37; 714/819
[58] Field of Search ........................ 395/185.01, 185.02, 395/183.18, 183.19, 183.06, 183.03, 185.07, 183.16, 183.01; 371/21.1, 22.2, 67.1, 25.1, 22.1; 714/48, 49, 42, 43, 30, 37, 54, 718, 719, 819

[56] References Cited

U.S. PATENT DOCUMENTS

| | | |
|---|---|---|
| 4,366,393 | 12/1982 | Kasuya ................................ 307/221 R |
| 4,510,603 | 4/1985 | Catiller ..................................... 371/21 |
| 4,516,202 | 5/1985 | Kadowaki ............................... 364/200 |
| 4,571,677 | 2/1986 | Hirayama et al. ................. 395/185.02 |
| 4,677,586 | 6/1987 | Magar et al. ........................... 364/900 |
| 4,763,248 | 8/1988 | Kitada ................................ 395/185.01 |
| 4,823,307 | 4/1989 | Melgara et al. ................... 395/185.01 |
| 4,879,717 | 11/1989 | Sauerwald et al. .................... 371/22.3 |
| 5,184,325 | 2/1993 | Lipovski ............................ 365/189.07 |
| 5,471,487 | 11/1995 | Andrighetti ............................ 371/57.1 |
| 5,706,423 | 1/1998 | Sugimoto .......................... 395/185.02 |

FOREIGN PATENT DOCUMENTS

| | | | |
|---|---|---|---|
| 1-015835 | 1/1989 | Japan .............................. G06F 11/22 |
| 64-15835 | 1/1989 | Japan .............................. G06F 11/22 |

*Primary Examiner*—Joseph E. Palys
*Attorney, Agent, or Firm*—Young & Thompson

[57] ABSTRACT

A data processor has an internal data bus and an instruction fetch bus provided separately from each other. When a data-read operation mode is designated, data stored in an internal read only memory are read out onto both the internal data bus and the instruction fetch bus, and the data on these buses are then subject to an operation by an execution unit to check the coincidence therebetween, the comparison resultant signal being transferred to the outside.

3 Claims, 6 Drawing Sheets

DATA PROCESSOR HAVING DATA BUS AND INSTRUCTION FETCH BUS PROVIDED SEPARATELY FROM EACH OTHER

This is a continuation of application Ser. No. 08/523,252, filed Sep. 5, 1995, now U.S. Pat. No. 5,706,423.

BACKGROUND OF THE INVENTION

1. Field of the Invention

The present invention relates to a data processor and, more particularly, to a single chip data processor having an instruction fetch bus and a data bus provided separately from each other for a read only memory (ROM).

2. Description of the Prior Art

In a data processor in which an internal ROM is provided for storing a program consisting of instruction codes and operand data to be processed (called collectively "data"), it is necessary to check whether or not the data stored in the ROM are correct at the time of its manufacture. It is also necessary to ensure the data-read-out paths from the ROM. In particular, in a data processor of the type in which an instruction fetch bus and an internal data bus are provided separately, check of both of the output path to the data bus from the ROM and the output path to the fetch bus from the ROM becomes necessary.

Figure 5:
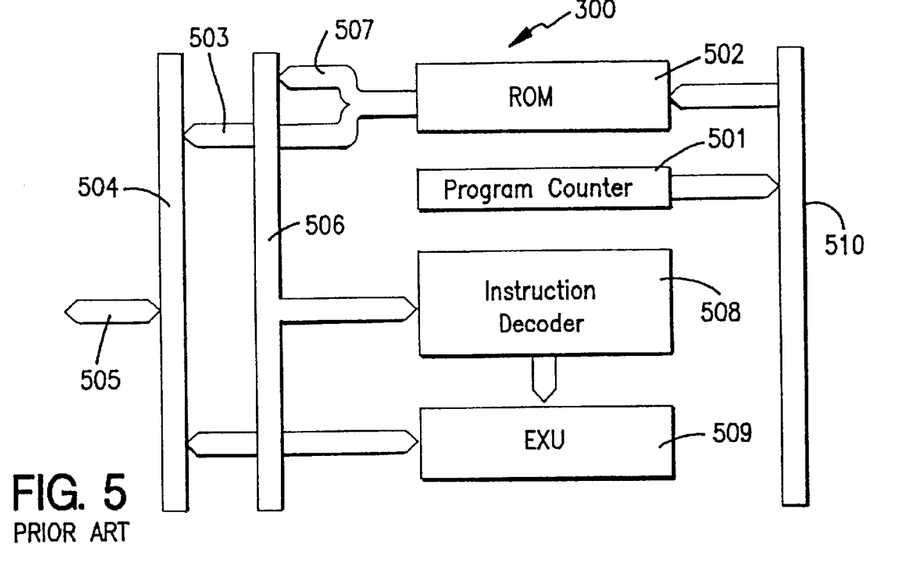
FIG. 5 is a block diagram showing a conventional data processor.

Referring now to FIG. 5, the conventional data processor 500 of such a type is constructed as a three-bus configuration in which an internal data bus 504, an internal instruction fetch bus 506 and an internal address bus 510 are provided separately from one another. This data processor further includes a program counter 501, an internal ROM 502, an external bus 505 coupled to the data bus 504, an instruction decoder 508 coupled to the fetch bus 506, an execution unit (EXU) 509 coupled to the decoder 508 and the data bus 504.

The data processor 500 has three operation modes consisting of a normal operation mode, a test execution mode and a ROM-data read-out mode. In the normal operation mode, the programs stored in a user area of the ROM 502 is executed. In the test execution mode, a test program stored in a test area of the ROM 502 is executed to test the respective circuit operation. In the read-out mode, the data in the ROM 502 is read out to the outside. One of these operation modes is selected by means of a mode switching circuit (not shown).

In checking the contents of the ROM 502, therefore, the ROM-data read-out mode, is selected and initiated to read out the data of the ROM 502 by sequentially supplying addresses thereto from the program counter 501. The data read out of the ROM 502 are then transferred to the internal data bus 504 through the output path 503 and further to the external bus 505. The data transferred to the external bus 505 are compared with the (expected data) by an externally provided testing device. At this time, the output path 503 from the ROM 502 to the internal data bus 504 is checked simultaneously. However, the output path 507 from the ROM 502 to the internal fetch bus 506 is not checked. In order to check the output path 507, therefore, the data processor is next brought into the testing execution mode to execute the test program stored in the test area of the ROM 502. The execution resultant data are compared with the expected values by means of the testing device. In this way, whether the instruction codes of the testing programs are read correctly can be determined together with checking a data transfer path including the output path 507.

Figure 6:
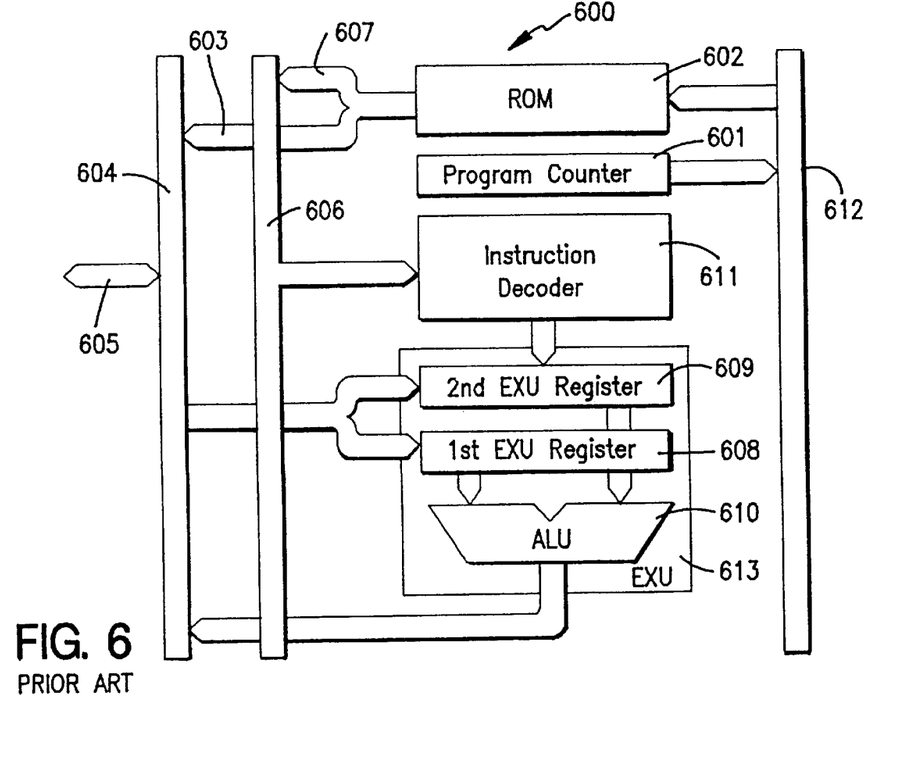
FIG. 6 is a block diagram showing another conventional data processor.
Figure 7A:
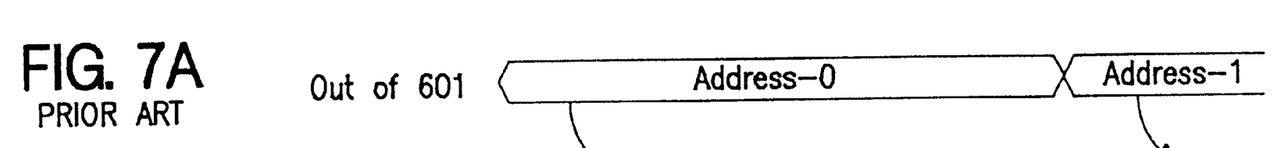
FIG. 7A–7G are timing charts showing an operation of the data processor as shown in FIG. 6.
Figure 7B:
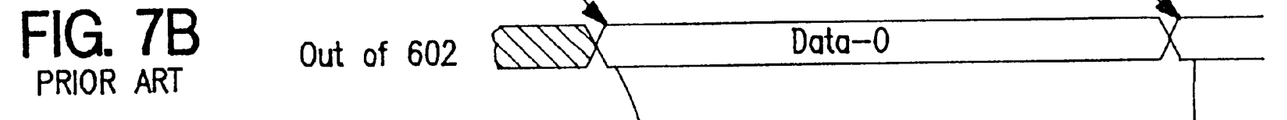
Figure 7C:
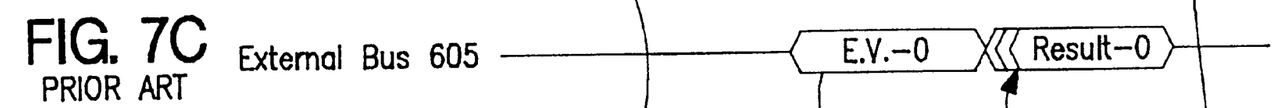
Figure 7D:
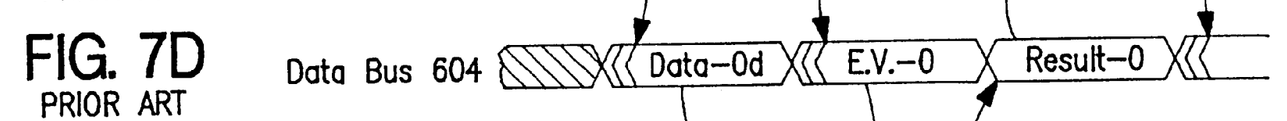
Figure 7E:
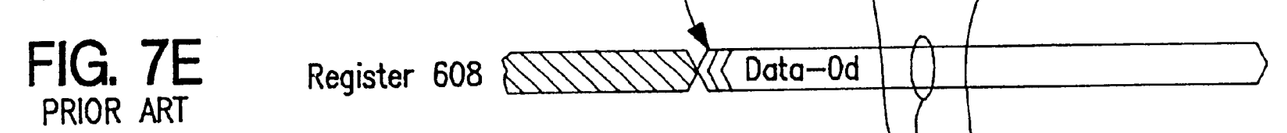
Figures 7F, 7G:
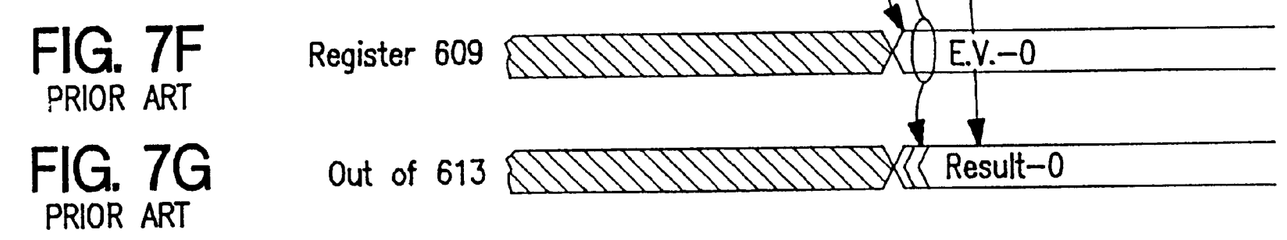

Turning to FIG. 6, there is shown another data processor 600 which is disclosed in Japanese Laid-Open Patent Application Sho. 64-15835. This data processor 600 also employs the three-bus configuration consisting of an internal bus 604, an internal fetch bus 606 and an internal address bus 612, and includes a program counter 601, an internal ROM 602, an output path 603, an external bus 605, an output path 607, an instruction decoder 611, and an EXU 613. This EXU 613 is constituted by including a first EXU register 608, a second EXU register 609 and an arithmetic and logic unit (ALU) 610. In this data processor 600, to check the built-in ROM 602 the processor is set to the ROM read mode, so that the data in the ROM 602 are read based on the addresses produced sequentially by the program counter 601 and then transferred to the internal data bus 604 through the output path 603, as shown in the timing charts of FIGS. 7A–7G. However, the data transferred to the internal data bus 604 are latched in the first EXU register 608 within the EXU 613 instead of being output to the external bus 605. The expected values are read from the outside through the external bus 605, and are latched in the second EXU register 609 through the internal data bus 604. Subsequently, the data in the first EXU register 608 and the data in the second EXU register 609 are compared by the ALU 610, and the comparison result is output to the outside through the internal data bus 604 and the external bus 605. The data on the external bus 605 are compared with the expected values by means of an external testing device. Thus, the output path 603 from the built-in ROM 602 to the internal data bus 604 is checked simultaneously. Since the output path 607 from the built-in ROM 602 to the internal fetch bus 606 is not checked, however, the test operation mode is set and initiated similarly to the data processor 500 as shown in FIG. 5.

Specifically, similar to the case of the conventional data processor as shown in FIG. 5, the data processor is next set to the testing executing mode in order to check the output path 607, and the processor executes the testing programs stored for testing in advance in the test area of the built-in ROM 602 in a manner similar to the normal operation mode and the state of an external terminal (not shown) connected to the internal fetch bus 606 during the execution sequence is compared with the expected values by means of an external testing device. In this way, whether the instruction codes of the testing programs are read correctly can be determined, thereby enabling the indirect check on the output path 607.

In the conventional data processors described in the above, the check on the built-in ROM and the check on the output path from the built-in ROM to the internal data bus in the built-in ROM read mode, and the check on the output path from the built-in ROM to the internal fetch bus in the testing execution mode have to be carried out separately, so that there exists a problem in that the reduction in the test-turnaround-time (TAT) is not easy.

Moreover, the check on the output path from the built-in ROM to the internal fetch bus is carried out indirectly by the execution of the instruction codes of the testing programs stored in the test area of the built-in ROM. Therefore, the data that can be passed from the built-in ROM to the internal fetch bus are restricted to the instruction codes of the testing programs stored in the test region of the built-in ROM having only a limited memory space, so that it has a problem in that the bit patterns of the data are restricted and the testability is deteriorated.

Further, it is necessary to place testing programs by securing a test area in the built-in ROM, which results in the reduction in the user area or the increase in the space of the built-in ROM, giving rise to the problem of obstructing the improvement of the cost performance.

SUMMARY OF THE INVENTION

It is therefore an object of this invention to provide an improved data processor.

It is another object of the present invention to provide a data processor in which an internal data bus and an instruction fetch bus are provided separately from each other and checks for a data path between an internal memory and the data bus and that between the memory and the fetch bus are performed easily.

A data processor, according to the present invention comprises storage means such as ROM storing instruction codes and operand data, a fetch bus and a data bus provided separately from each other, the data read out of the storage means being supplied to both the fetch bus and the data bus, and an execution unit performs an operation on the data of the fetch bus and the data bus to supply the outside with the result of comparison.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
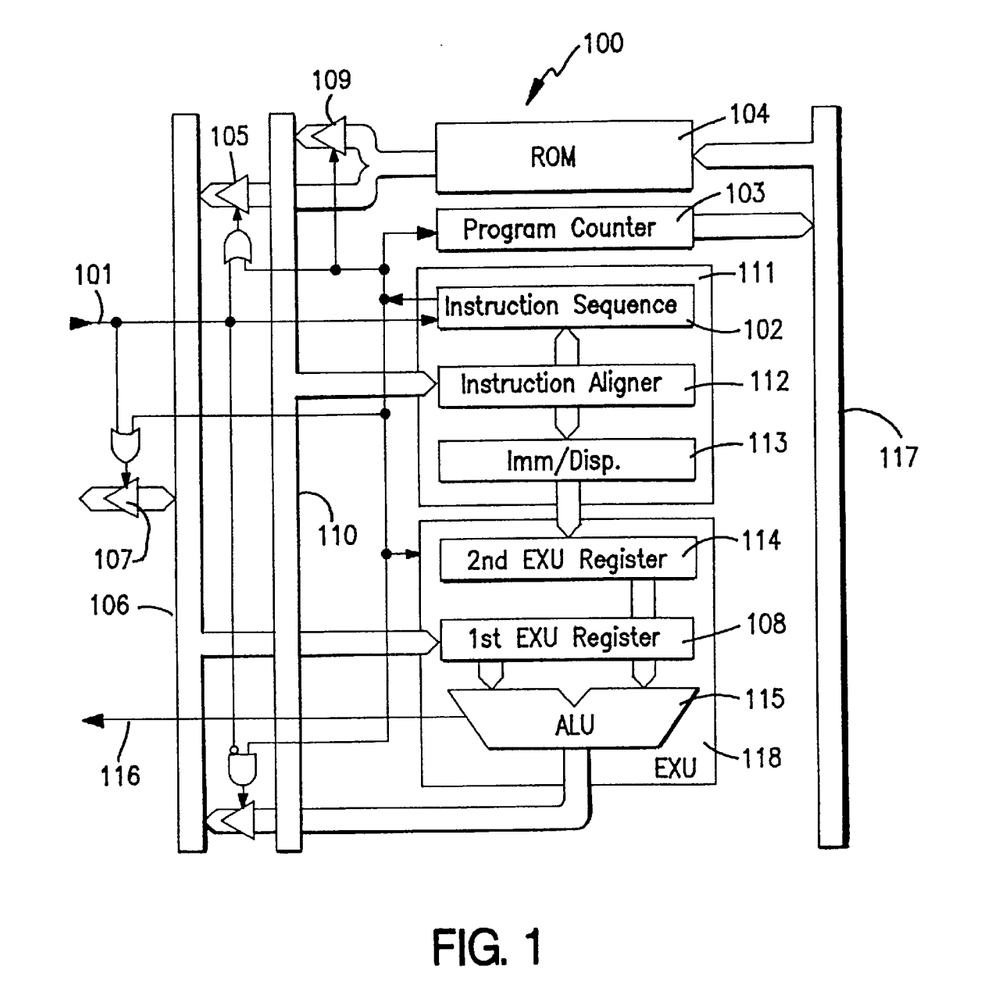
FIG. 1 is a block diagram showing a data processor according to a first embodiment of the invention.
Figure 2A:
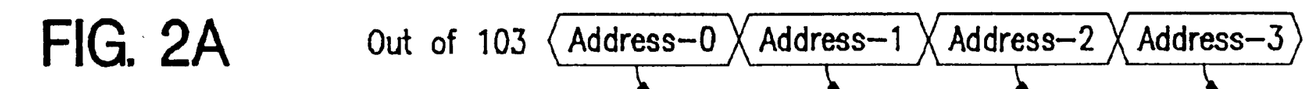
FIGS. 2A–2H are timing charts showing an operation of the data processor as shown in FIG. 1.
Figure 2B:
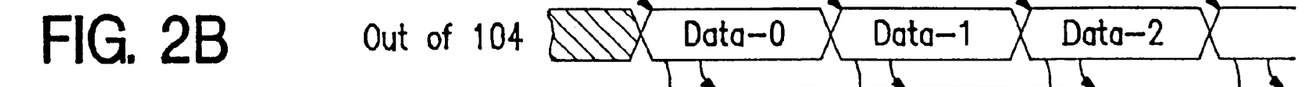
Figure 2C:
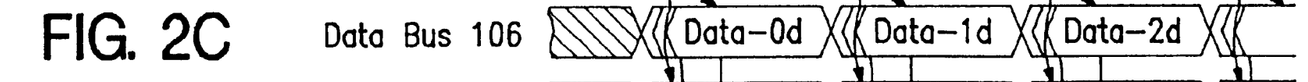
Figure 2D:
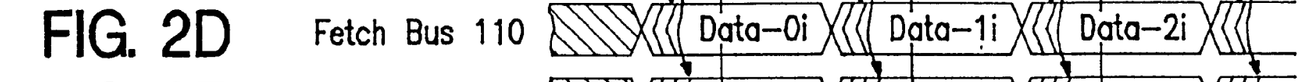
Figure 2E:
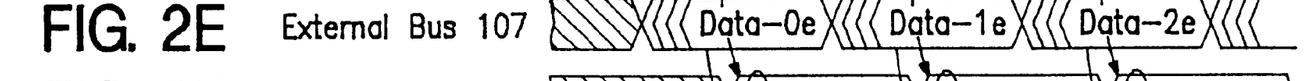
Figure 2F:
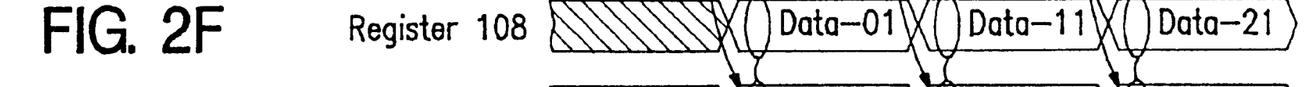
Figure 2G:
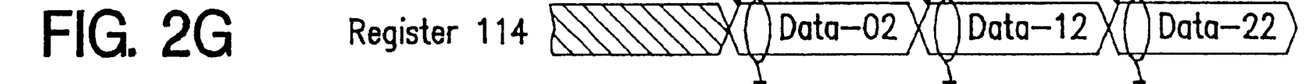
Figure 2H:
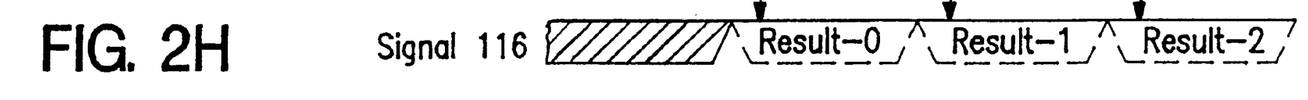

Referring now to FIG. 1, a data processor 100 according to a first embodiment of this invention is fabricated on a single semiconductor chip and receives a mode switching signal 101 for indicating its operating mode. This processor 100 includes a program counter 103 for holding the address of an internal ROM 104 into which an instruction code to be executed is stored, an internal ROM 104 having only a user area for storing a program consisting of instruction codes and operand data. This ROM 104 thus does not have a test area for storing a testing program. The processor 100 further includes an internal data bus 106 for reading data from the ROM 104 through an output path 105, an external bus 107 for carrying out transfer of data to the outside, an internal instruction fetch bus 110 for reading data from the ROM 104 through an output path 109, an instruction decoder 111 for decoding an instruction code, a data signal 116 for outputting information on computational result of an ALU 115 to the outside, an internal address bus 117 for transferring an address to be used internally, and an EXU 118.

The instruction decoder 111 is constituted by including an instruction sequencer 102 for controlling the instruction sequence, an instruction aligner 112 for holding instruction codes by aligning them, an immediate value/displaced value generating mechanism (abbreviated as imm/disp generating mechanism hereinafter) 113 for generating an immediate value or a displaced value from an instruction code.

The EXU 118 is constituted of a first EXU register 108 for holding data on the internal data bus 106, a second EXU register 114 for holding an output data of the instruction decoder 111, and an ALU 115 for carrying out an operation on the data from the first EXU register 106 and the second EXU register 114.

The mode switching signal 101 is set to be able to switch the output path 105 and the external bus 107 via a gate. Further, it is set to be able to switch the output path from the ALU 115 to the internal data bus 106 via a gate.

With the above construction, the data processor 100 has only the two modes of a normal operating mode and a ROM-data read-out mode (namely, does not have testing execution mode), and is capable of switching between these two modes by means of a mode switching circuit (not shown) analogous to the conventional data processor.

Next, the description will be made of an operation with reference also to the timing charts in FIGS. 2A–2H. First, for checking the contents of the ROM 104, the processor is set to the ROM-data read-out mode by turning the mode switching signal 101 to an active high level. Thus, the instruction sequencer 102 within the instruction decoder 111 realizes a through state in which the data on the internal fetch bus 110 is output as it is, by fixing the instruction aligner 112 and the imm/disp generating mechanism 113 to the state same as at the time of execution of an instruction code for generating immediate value/displaced value of the word length. In addition, by the activation of the mode switching signal 101, the output path 105 and the external bus 107 are set to the output enable state and the output path 109 is also set to the output enable state via the instruction sequencer 102. It is to be noted here that the output path from the ALU 115 to the internal data bus 106 is set to the output disable state.

Next, as shown by the line "address 0"→"data 0"→"data 0d"→"data 0e" and "data 01" of the timing chart in FIG. 2, the data in the built-in ROM 104 are read from the ROM 104 based on the address produced sequentially by the program counter 103, transferred to the internal data bus 106 through the output path 105, and output to the external bus 107 which is set to the output enable state by the mode switching signal 101. The data on the internal data bus 106 is latched in the first EXU register 108 within the EXU 118.

On the other hand, as shown by the line "data 0"→"data 0i"→"data 02" of the timing charts in FIGS. 2A–2H, the data read from the ROM 104 are transferred to the internal fetch bus 110 through the output path 109 set to the output enable state by the mode switching signal 101 via the instruction sequencer 102 and latched in the second EXU register 114 within the EXU 118 through the instruction aligner 112 and the imm/disp generating mechanism 113 within the instruction decoder 111. Subsequently, the ALU 115 compares the data in the first EXU register 108 with the data in the second EXU register 114 to output the data coincident signal 116 is to an externally provided testing device, as shown by the line "data 01" and "data 02"→"result 0" as shown in FIGS. 2A–2H. The high level of the signal 116 indicates coincidence, whereas the low level thereof indicates inequality in this embodiment.

The external testing device compares the data output to the external bus 107 with its expected value and further compares the value of the data agreement signal 116 with its expected value. Thus, the agreement of the data stored in the built-in ROM 104 with its expected value can be checked, as well as the check on the output path 105 from the ROM 104 to the internal data bus 106 and the output path 109 from the ROM 104 to the internal fetch bus 110 can be carried out. In other words, the check on the ROM 104, the output path 105 and the output path 109 can be carried out simultaneously by a single check in the ROM read mode.

In the data processor of the first embodiment, the data in the ROM 104 are read simultaneously to the internal data bus 106 and the internal fetch bus 110, and the data on the internal data bus 106 are output to the outside through the external bus 107 as well as the agreement/disagreement of the data on the internal data bus 106 and the data on the internal fetch bus 110, as determined by the comparison in the ALU, is output to the outside as the data agreement signal 116. Since the check on the output path 109 from the ROM 104 to the internal fetch bus 110 can be carried out simultanesouly with the checks on the ROM 104 and the output path 105 from the ROM 104 to the internal data bus 106, the testing time can be put to zero by omitting the execution of the testing programs in the testing execution mode which was required by the conventional data processor, and the test TAT can be reduced drastically by setting the checking time in the ROM read mode to ⅓ of that of the conventional data processor. Moreover, since all the data in the ROM 104 pass the output path 109 from the built-in ROM 104 to the internal fetch bus 110, it is possible to achieve 100% effective failure detection. Furthermore, since the check on the ROM 104, the output path 105 from the ROM 104 to the internal data bus 106 and the output path 109 from the ROM 104 to the internal fetch bus 110 can be accomplished simultaneously by a small addition of circuits to the existing resources, the increase in the chip size of the data processor can be minimized, thereby contributing extremely to the practical effect on the reduction of the cost and the efficiency of the test, along with the reduction in the test TAT.

Figure 3:
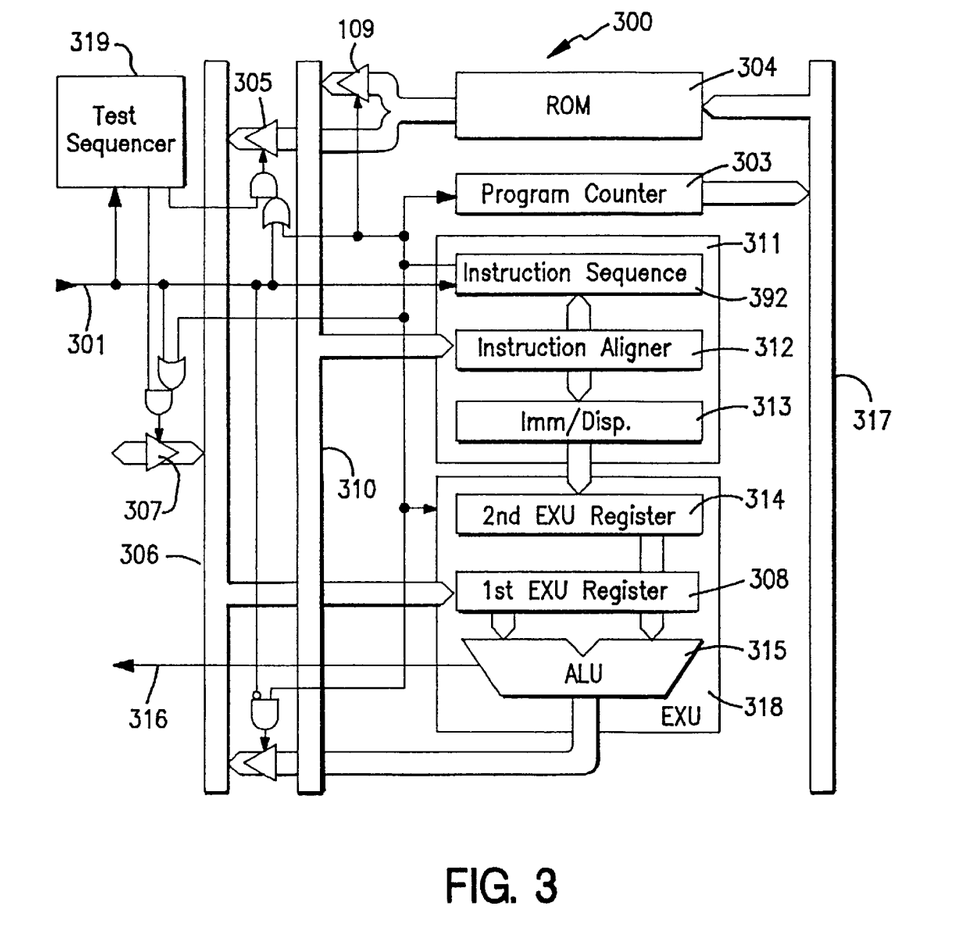
FIG. 3 is a block diagram showing a data processor according to a second embodiment of the invention.

Turning to FIG. 3, a data processor 300 according to a second embodiment of this invention is fabricated on a single semiconductor chip and receives a mode switching signal 301 designating its operating mode. This processor 300 includes a program counter 303 for holding the address of an instruction code to be executed, an internal ROM 304 having only a user area for storing data (namely, not having a test area for storing testing programs), an internal data bus 306 for reading data from the built-in ROM 304 through an output path 305, an external bus 307 for transferring data with the outside, an internal fetch bus 310 for reading data from the built-in ROM 304 through an output path 309, an instruction decoder 311 for decoding an instruction code, a data agreement signal 316 for outputting to the outside information on the computational result of an ALU 315, an internal address bus 317 for transferring an address used internally, an EXU 318 and a test sequencer 319.

The instruction decoder 311 is constituted by an instruction sequencer 302 for controlling an instruction sequence, an instruction aligner for holding the instruction codes by aligning them, and an immediate value/displaced value generating mechanism (imm/disp generating mechanism) 313 for generating the immediate value and a displaced value from an instruction code.

The EXU 318 is constituted by including a first EXU register 308 for holding data on the internal data bus 306, a second EXU register 311 for holding the output data of the instruction decoder 311 and an ALU 315 for carrying out an operation on the data from the first EXU register 306 and the data in the second EXU register 314.

The mode switching signal 301 is set so as to be able to switch the output path 305 and the external bus 307 via a gate. Further, it is set so as to be able to switch the output path from the ALU 315 to the internal data bus 306 via a gate.

The processor 300 has only the two modes of normal operating mode and the built-in ROM read mode (that is, does not have the testing execution mode) analogous to the data processor 100 as shown in FIG. 1, and the switching between them can be carried out by means of a mode switching circuit (not shown). In contrast to the data processor 100 shown in FIG. 1, in the data processor 300, instead of outputting the data read from the ROM 304 to the external bus 307 and letting an external testing device compare it with its expected value, the expected value is read to the first EXU register 308 through the external bus 307. Then, the result of comparison of the data in the first EXU register 308 and the data in the second EXU register 314 by the ALU 315 is informed to the outside as the data agreement signal 316 which gives information on agreement/disagreement. Accordingly, the external testing device carries out a check by comparing the data agreement signal 316 alone with its expected value.

Next, referring to a timing charts in FIGS. 4A–4H, the operation of the second embodiment of the data processor constituted as in the above will be described.

First, at the check of the ROM 304, the mode switching signal 301 is activated by the mode switching circuit to set the processor to the ROM-data read-out mode. Then, the instruction sequencer 302 within the instruction decoder 311 sets the processor to a through state which outputs the data on the internal fetch bus 310 as it is, by fixing the instruction aligner 312 and the imm/disp generating mechanism 313 to the state similar to that at the time of executing an instruction code for generating the immediate value/displaced value of the word length. Moreover, by the activation of the mode switching signal 301, the output path 305 is set to the output enable state and the external bus 307 is set to the input enable state, and the output path 309 is also set to the output enable state via the instruction sequencer 302. Furthermore, the test sequencer 319 is actuated and controlled so as to alternately read to the internal data bus 306 the data in the built-in ROM 304 and an expected value from the outside by alternately opening and closing the output path 305 and the external bus 307. Here, the output path from the ALU 315 to the internal data bus 306 is set to the output disable state.

Figure 4A:
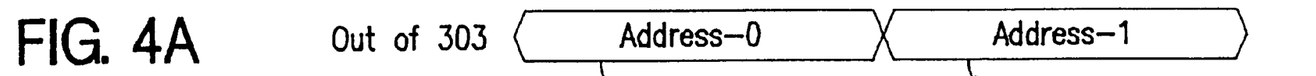
FIGS. 4A–4H are timing charts showing an operation of the data processor as shown in FIG. 3.
Figure 4B:
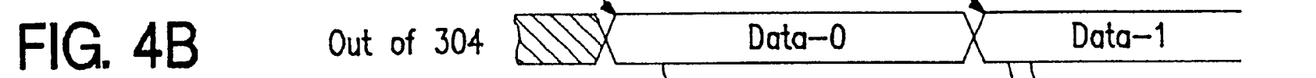
Figure 4C:
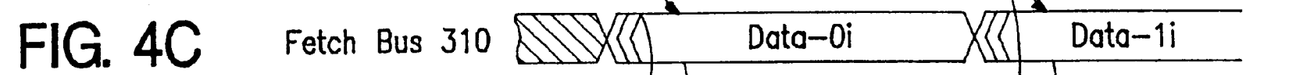
Figure 4D:
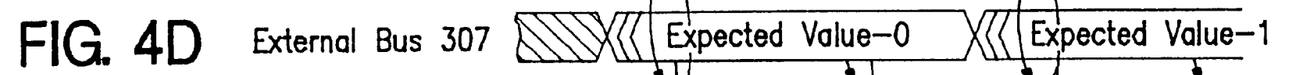
Figure 4E:
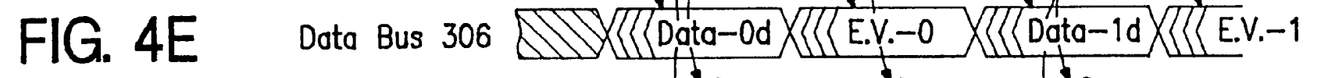
Figure 4F:
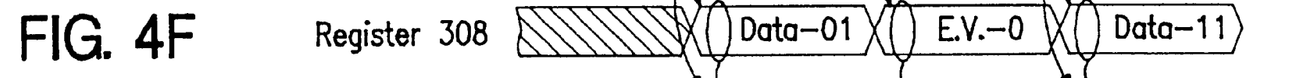
Figure 4G:
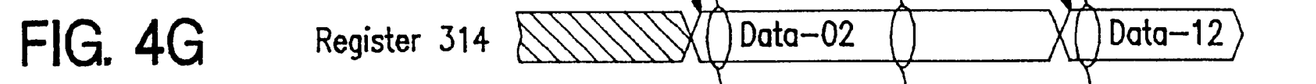
Figure 4H:
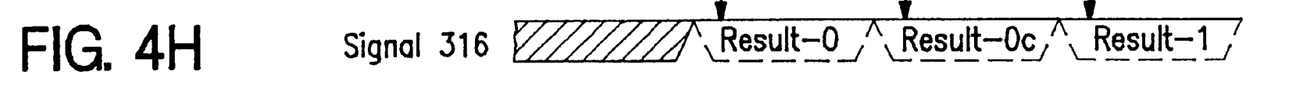

Next, as shown by the line "address 0"→"data 0"→"data 0d"→"data 01" of the timing charts of FIGS. 4A–2H, data in the built-in ROM 304 are read based on the address sequentially produced by the program counter 303, transferred to the internal data bus 306 through the output path 305 and latched in the first EXU register 308. On the other hand, as shown by the line "data 0→"data 0i"→"data 02" of the timing charts of FIGS. 4A–4H, data read from the built-in ROM 304 are transferred to the internal fetch bus 310 through the output path 309 set to the output enable state by the mode switching signal 301 via the instruction sequencer 302, and go through the instruction aligner 312 and the imm/disp generating mechanism 313 in the instruction decoder 311 to be latched in the second EXU register 314 within the EXU 318.

Subsequently, the ALU 315 compares the data in the first EXU register 308 with the data in the second EXU register 314, and, as shown by the line "data 01" and "data 02"→37 result 0" of the timing charts in FIGS. 4A–4H, informs the external testing device about the agreement/disagreement of the data by setting it, for example, to a high level when they are in agreement and to a low level when they are in disagreement.

The external testing device compares the value of the data agreement signal 316 with its expected value. By so doing, it becomes possible to check the agreement of the data stored in the ROM 304 and their expected values, and also it becomes possible to carry out the check on the output path 305 from the built-in ROM 304 to the internal data bus 306 and the output path 309 from the built-in ROM 304 to the internal fetch bus 310. In other words, the check on the built-in ROM 304, the output path 305 and the output path 309 can be accomplished simultaneously by a single check in the built-in ROM read mode.

In the data processor of the second embodiment, the data in the built-in ROM 304 are simultaneously read to the internal data bus 306 and to the internal fetch bus 310, and the expected values of the data in the built-in ROM 304 are read to the internal data bus 306 through the external bus 307 so as to output to the outside the agreement/disagreement of the result of comparison by the ALU 315, of the data on the internal data bus 306 and the data on the internal fetch bus 310 as the data agreement signal 316. By so doing, it is possible to carry out the check on the output path 309 from the built-in ROM 304 to the internal fetch bus 310 simultanesouly with the check on the built-in ROM 304 and the output path 305 from the built-in ROM 304 to the internal data bus 306, so that it is advantageous from the viewpoint of maintaining data security because of the data in the ROM 304 not being taken out directly to the outside. Thus, it is possible to put the testing time to zero by eliminating the execution of the testing programs in the testing execution mode which was required in the conventional data processor, and it is also possible to reduce drastically the test TAT by completing the data comparison of one data in the ROM 304 by the two states, and by setting the checking time in the ROM read mode to ⅓ of the case for the conventional data processor. Moreover, analogous to the case of the first embodiment of the data processor, all of the data in the ROM 304 are passed through the output path from the ROM 304 to the internal fetch bus 310, so that it is possible to achieve 100% effective failure detection. Furthermore, analogous to the case of the first embodiment of the data processor, it is possible to accomplish simultaneously the checks on the ROM 304, the output path 305 from the ROM 304 to the internal data bus 306 and the output path 309 from the ROM 304 to the internal fetch bus 310. Since the increase in the chip size of the data processor can be minimized in this way, the practical effects on the reduction in the cost and the efficiency of the test can be enhanced extremely, along with the shortening of the test TAT.

As described in the above, in a data processor having storage means for storing program information consisting of instruction codes and processing data, and having a fetch bus for reading an instruction code from the storage means being separated from a data bus for reading processing data from the storage means, the data processor according to this invention is provided with means for simultaneously reading an identical program information to the fetch bus and the data bus from the storage means, an arithmetic unit for inputting the respective pieces of information of the fetch bus and the data bus and means for informing the result of comparison by the arithmetic unit to the outside. Therefore, it is possible to carry out simultaneously the check on the storage means, the read path from the storage means to the data bus and the read path from the storage means to the fetch bus, and the data processor of this invention has the effects of nullifying the testing time for the execution of the testing programs in the testing execution mode, which is required by the conventional data processor, by omitting the testing programs, and shortening the test TAT by drastically reducing the testing time to ⅓ of what is needed by the conventional data processor. Moreover, in a data processor having storage means for storing program information consisting of instruction codes and processing data, and having a fetch bus for reading an instruction code from the storage means which is separated from a data bus for reading processing data from the storage means, the data processor of this invention has means for reading program information to the fetch bus from the storage means, means for inputting an arbitrary data to the data bus from the outside, an arithmetic unit for inputting respective pieces of information of the fetch bus and the data bus and means for informing the result of comparison by the arithmetic unit to the outside. Furthermore, all of the data in the storage means are passed through the read path from the storage means to the fetch bus, so that it is possible to achieve 100% effective failure detection. Furthermore, it is possible to carry out simultaneously the check on the storage means, the read path from the storage means to the data bus and the read bus from the storage means to the fetch bus. Therefore, along with the shortening in the test TAT, the practical effect on the reduction of the cost and the efficiency of the tests will be extremely high since the increase in the chip size of the data processor can be minimized.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A data processing apparatus having a normal processing mode and a test mode, comprising:
   a memory storing data;
   a first bus transferring data from said memory in said test mode;
   a second bus transferring data from said memory in said test mode;
   a decoder receiving said data present on said first bus and transferring said data to a node in said test mode; and
   an executing unit comparing said data present on said second bus to said data present on said node and out-putting a result of said comparison in said test mode.

2. The data processing apparatus as claimed in claim 1, wherein said data on said first bus and said second bus are stored in said second register and said first register at the same time, respectively.

3. The data processing apparatus as claimed in claim 1, further comprising means provided independent of said first and second buses for outputting said result of comparison.

* * * * *